United States Patent
Chen et al.

[11] Patent Number: 6,082,657
[45] Date of Patent: Jul. 4, 2000

[54] WIRE-FEEDING DEVICE USING LOGICAL CIRCUITRY AND MULTIPLE SENSORS

[75] Inventors: Chun-Wen Chen, Taichung Hsien; Wen-Shin Peng, Hsinchu Hsien, both of Taiwan

[73] Assignee: Powerchip Semiconductor Corp., Hsin-Chu, Taiwan

[21] Appl. No.: 09/247,855

[22] Filed: Feb. 11, 1999

[51] Int. Cl.[7] .................................................. B65H 23/06
[52] U.S. Cl. .................................. 242/420.6; 242/412.2; 242/413.5; 242/418.1
[58] Field of Search .............................. 242/412.2, 413.1, 242/413.3, 413.4, 413.5, 417, 417.1, 417.3, 418.1, 420.5, 420.6, 563.1

[56] References Cited

U.S. PATENT DOCUMENTS

| | | | |
|---|---|---|---|
| 2,011,653 | 8/1935 | Rufsvold | 242/413.1 |
| 2,900,143 | 8/1959 | Bandy et al. | 242/418.1 |
| 3,259,330 | 7/1966 | Baybick et al. | 242/417.2 |
| 3,603,522 | 9/1971 | Herrmann | 242/417 |
| 3,784,071 | 1/1974 | Milan | 242/418.1 |
| 4,030,131 | 6/1977 | Beiter et al. | 242/412.2 X |
| 4,124,340 | 11/1978 | LaSpisa et al. | 242/412.2 |
| 4,253,597 | 3/1981 | Waffner | 242/417.1 X |
| 4,469,291 | 9/1984 | Treiber et al. | 242/418.1 |
| 4,500,043 | 2/1985 | Brown | 242/413.3 |
| 5,501,412 | 3/1996 | McAleavey | 242/417.1 |
| 5,697,573 | 12/1997 | Fukuchi et al. | 242/412.2 |
| 5,709,352 | 1/1998 | Rogers et al. | 242/417.1 |
| 5,713,533 | 2/1998 | Nordlof et al. | 242/418.1 |

FOREIGN PATENT DOCUMENTS

| | | | |
|---|---|---|---|
| 3343286 | 6/1985 | Germany | 242/413.4 |
| 81003651 | 12/1981 | WIPO | 242/412.2 |

*Primary Examiner*—Donald P. Walsh
*Assistant Examiner*—Emmanuel M. Marcelo
*Attorney, Agent, or Firm*—Finnegan, Henderson, Farabow, Garrett & Dunner, L.L.P.

[57] ABSTRACT

A wire-feeding device comprises a wire supply, a buffer tension, a plurality of sensors, a driver and a logical circuit. The wire supply is used for supplying a wire. The buffer tension laterally blows at the wire so that a section of the wire is bent. The sensors are provided beside the bent section of the wire to detect the bent section. The driver is used for driving the wire supply to supply the wire. The logical circuit is coupled between the sensors and the driver to actuate the driver when the bent section of the wire is outside regions which the sensors detect.

2 Claims, 3 Drawing Sheets

WIRE-FEEDING DEVICE USING LOGICAL CIRCUITRY AND MULTIPLE SENSORS

BACKGROUND OF THE INVENTION

1. Field of the Invention

The present invention relates in general to a wire-feeding device for correctly supplying an Au-wire in a bonding process.

2. Description of the Related Art:

Referring to FIG. 1, a conventional wire-feeding device includes an Au-wire supply 17, a driver 16, a buffer tension 11 and a blow tension 12. The wire supply 17 is actuated by the driver 16 to supply an Au-wire wrapped round the wire supply 17. Furthermore, the buffer tension 11 has a body 111 and two pulleys 112, 112' provided on both sides of the body 111. The Au-wire is stretched over the pulleys 112, 112' and connected to the blow tension 12.

In operation, the Au-wire is laterally blown by the buffer tension 11 and meanwhile axially blown by the blow tension 12, as indicated by the arrows in FIG. 1, so that a section 13 of the Au-wire between the pulleys 112, 112' is bent (hereinafter the bent section of the Au-wire is called the "wire loop"). A sensor 14 is provided beside the wire loop 13 to detect the wire loop 13 and send a signal to the driver 16 of the Au-wire supply 17 through an amplifier 15, in order to determine if supplying the Au-wire is required.

The Au-wire is expended during the bonding process. Accordingly, the wire loop 13 contracts in size until the sensor 14 fails to detect the wire loop 13. When the sensor 14 fails to detect the wire loop 13, an indicating lamp 18 of the amplifier 15 is extinguished, the driver 16 of the wire supply 17 is actuated and the wire supply 17 starts to supply the Au-wire. By this arrangement, a minimum size of the wire loop 13 can be maintained so that the bonding process can proceed normally.

However, if the air flow generated by the buffer tension 11 and the air flow generated by the blow tension 12 do not interact well, then the wire loop 13 will vertically shake. As shown in FIG. 2, it is possible for the shaking wire loop 13 to move outside the region which the sensor 14 detects. When the sensor 14 fails to detect the wire loop 13, the indicating lamp 18 of the amplifier 15 is extinguished, the driver 16 of the wire supply 17 is actuated and the wire supply 17 starts to supply the Au-wire. The wire loop 13 becomes longer and longer due to the continuous supply of the Au-wire. Finally, the bonding products have failures such as open shot, stitch peel off, wire break, abnormal loop and so on.

SUMMARY OF THE INVENTION

An object of the present invention is to provide a wire-feeding device that can effectively reduce the possibility of misjudgment of the wire supply.

The wire-feeding device of the present invention comprises a wire supply, a buffer tension, a plurality of sensors, a driver and a logical circuit. The wire supply is used for supplying a wire. The buffer tension laterally blows at the wire so that a section of the wire is bent. The sensors are provided beside the bent section of the wire to detect the bent section. The driver is used for driving the wire supply to supply the wire. The logical circuit is coupled between the sensors and the driver to actuate the driver when the bent section of the wire is outside regions which the sensors detect.

In the present invention, a plurality of sensors are provided beside the bent section of the wire. If the bent section of the wire is outside the detecting regions of some of the sensors, then other sensors can keep detecting the wire loop. Thus, the output of the NOR gate via a logical operation is kept at a low level and the driver is not actuated. Thereby, the bonding process can proceed normally. By this manner, the present invention can avoid product failures mentioned above.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
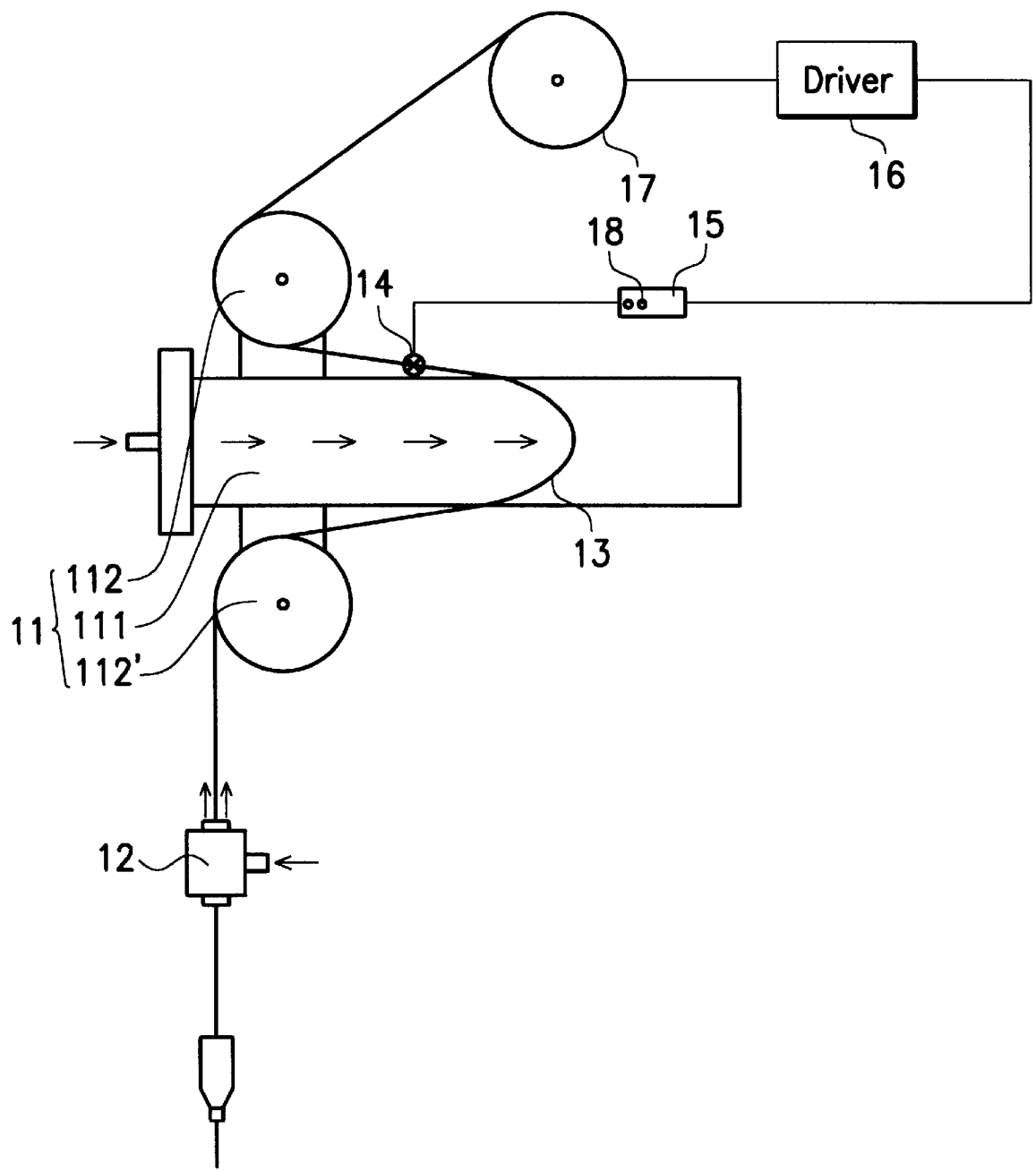
FIG. 1 is a schematic diagram of a conventional wire-feeding device.
Figure 2:
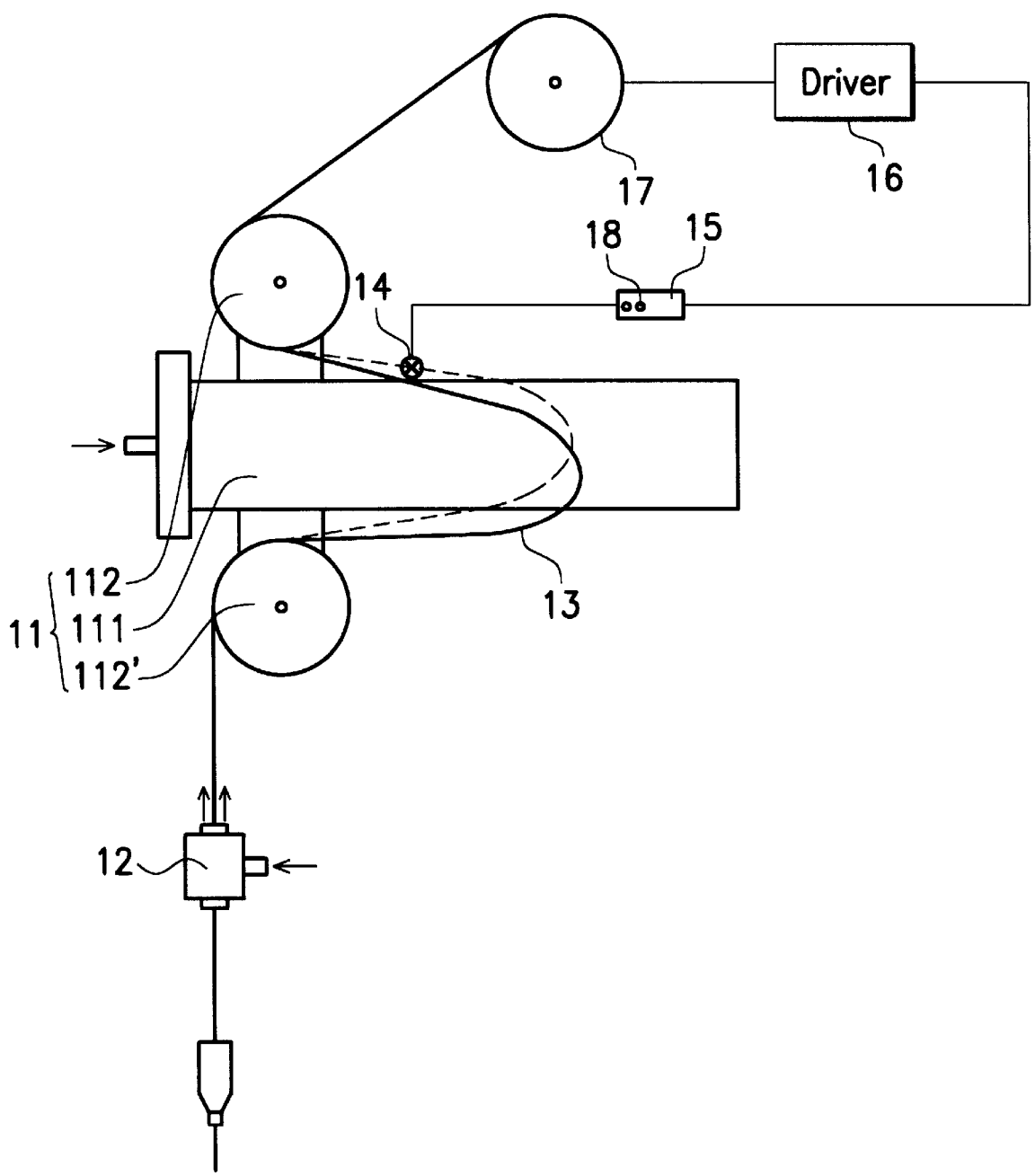
FIG. 2 depicts a shaking wire loop in accordance with FIG. 1.
Figure 3:
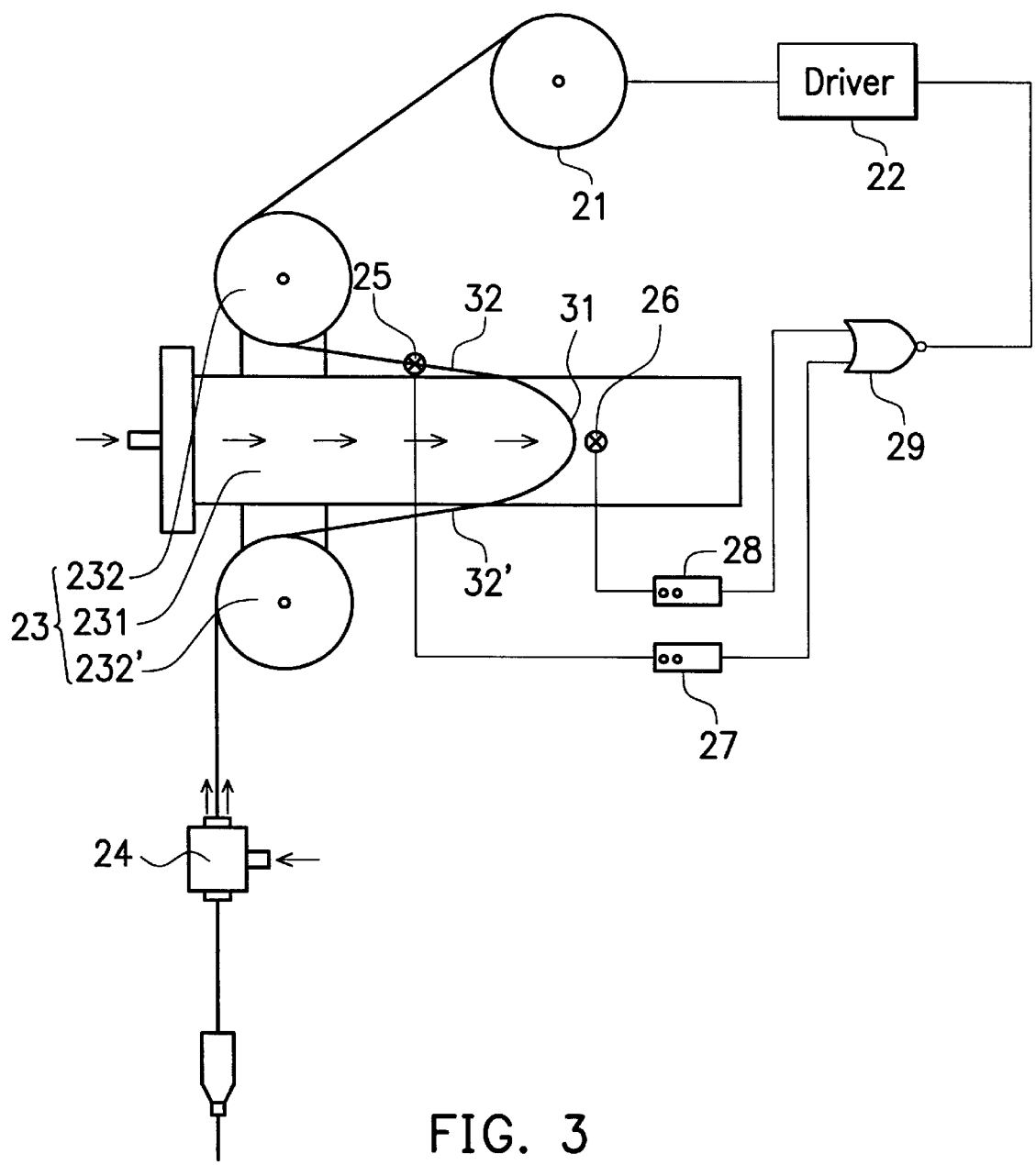
FIG. 3 is a schematic diagram of a wire-feeding device in accordance with the present invention.

Referring to FIG. 3, a wire-feeding device of the present invention includes an Au-wire supply 21, a driver 22, a buffer tension 23 and a blow tension 24. The wire supply 21 is actuated by the driver 22 to supply an Au-wire wrapped round the wire supply 21. Furthermore, the buffer tension 23 has a body 231 and two pulleys 232, 232' provided on both sides of the body 231. The Au-wire is stretched over the pulleys 232, 232' and connected to the blow tension 24.

In operation, the buffer tension 23 and the blow tension 24 simultaneously blow at the Au-wire as indicated by the arrows in FIG. 3. The Au-wire is laterally blown by the buffer tension 23 so that a section of the Au-wire between the pulleys 232, 232' is bent (hereinafter the bent section of the Au-wire is called the "wire loop"). Also, the Au-wire is axially blown by the blow tension 24 so that the Au-wire is in tension.

For convenient description, the above-mentioned wire loop is treated as a wire that consists of a middle section 31 and two side sections 32, 32'. A first sensor 25 is provided beside the side section 32 while a second sensor 26 is provided beside the middle section 31. The first sensor 25 and the second sensor 26 are coupled to input terminals of a NOR gate 29 through a first amplifier 27 and a second amplifier 28, respectively. The output terminal of the NOR gate 29 is coupled to the driver 22.

Generally, the output signals of the sensors 25, 26 are weak. Therefore, the amplifiers 27, 28 are coupled between the sensors 25, 26 and the NOR gate 29 to strengthen the output signals of the sensors 25, 26. The outputs of the sensors 25, 26 are low level (the indicating lamps of the amplifiers 27, 28 are dark) when the sensors 25, 26 fail to detect the wire loop 31. On the other hand, the outputs of the sensors 25, 26 are high level (the indicating lamps of the amplifiers 27, 28 are light) when the sensors 25, 26 can detect the wire loop.

As mentioned above, the input terminals of the NOR gate are coupled to the first and second amplifiers 27, 28 while the output terminal of the NOR gate is coupled to the driver 22. It is noted that a high-level output of the NOR gate is an actuating signal for the driver 22. Accordingly, if the output of the NOR gate is high level, then both inputs of the NOR gate are necessarily low level.

Figure 4:
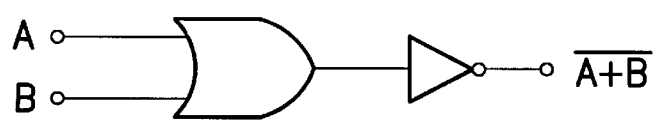
FIG. 4 schematically depicts a NOR gate.

FIG. 4 schematically depicts a NOR gate. Table 1 is the truth table of the NOR gate, wherein "0" represents a low level and "1" represents a high level.

TABLE 1

| Input | | Output |
|---|---|---|
| A | B | $\overline{A+B}$ |
| 0 | 0 | 1 |
| 0 | 1 | 0 |
| 1 | 0 | 0 |
| 1 | 1 | 0 |

If "A" represents the output of the first sensor 25 and "B" represents the output of the second sensor 26 and "A+B" represents the input of the driver 22, then table 1 can be rewritten as follows:

TABLE 2

| Indicating Lamp of First Amplifier | Indicating Lamp of Second Amplifier | Driver |
|---|---|---|
| Dark | Dark | Operate |
| Dark | Light | Stop |
| Light | Dark | Stop |
| Light | Light | Stop |

From table 2, the driver 22 does not operate unless the indicating lamps of the first and second amplifiers 27, 28 are both dark. That is, the Au-wire supply 21 operates when both the first and second sensors 25, 26 fail to detect the wire loop.

During the bonding process, it is possible for the wire loop to be outside the detecting region of the first sensor and yet not be consumed. However, the second sensor will keep detecting the wire loop. Thus, the output of the NOR gate via a logical operation is low level and the driver 22 is not actuated. Therefore, bonding process proceeds normally. By this manner, the present invention can avoid product failures mentioned above.

In practice, more than two sensors can be provided at proper positions beside the wire loop. All of the sensors are coupled to the NOR gate for logical operations. Such an arrangement can effectively reduce the possibility of misjudgment of the wire supply.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wire-feeding device comprising:

a wire supply for supplying a wire;

a buffer tension for laterally blowing at the wire so that a section of the wire is bent;

a plurality of sensors provided beside the bent section of the wire to detect the bent section;

a driver for driving the wire supply to supply the wire;

a logical circuit coupled between the sensors and the driver to actuate the driver when the bent section of the wire is outside regions which the sensors detect; and a plurality of amplifiers coupled between the sensors and the logical circuit to amplify signals of the sensors input into the logical circuit.

2. A wire-feeding device comprising:

a wire supply for supplying a wire;

a buffer tension for laterally blowing at the wire so that a section of the wire is bent;

a plurality of sensors provided beside the bent section of the wire to detect the bent section;

a driver for driving the wire supply to supply the wire; and a logical circuit coupled between the sensors and the driver to actuate the driver when the bent section of the wire is outside regions which the sensors detect, wherein the logical circuit is a NOR gate.

* * * * *